United States Patent

Yamashita et al.

[15] 3,668,408

[45] June 6, 1972

[54] LIGHT SENSOR MATRIX DEVICE CONSISTING OF PHOTO-CONDUCTIVE ELEMENTS

[72] Inventors: Oshio Yamashita, Hirakata; Manabu Yoshisa, Osaka; Nobuo Hasegawa, Uji; Saburo Kitamura, Kyoto, all of Japan

[73] Assignee: Matsushita Electric Industrial Co., Ltd., Osaka, Japan

[22] Filed: Mar. 15, 1971

[21] Appl. No.: 124,409

[30] Foreign Application Priority Data

Mar. 16, 1970 Japan....................................45/25705

[52] U.S. Cl...........................250/220 M, 174/68.5, 250/209

[51] Int. Cl...........................................................H01j 39/12

[58] Field of Search.............250/219 D, 219 DC, 239, 211 J, 250/208, 209, 220 M; 174/68.5; 317/101 B, 101 C, 235 N

[56] References Cited

UNITED STATES PATENTS

| | | | |
|---|---|---|---|
| 3,082,327 | 3/1963 | Rice | 250/220 M |
| 3,432,670 | 3/1969 | Dyn | 250/211 J |
| 3,538,389 | 11/1970 | Levesque et al. | 174/68.5 X |
| 3,605,061 | 9/1971 | Martin | 317/101 B |

*Primary Examiner*—Walter Stolwein
*Attorney*—Stevens, Davis, Miller & Mosher

[57] ABSTRACT

A light sensor matrix device for the static reading of punched cards and for the pattern recognition. It has groups of sandwich-type CdS photo-conductive elements arranged two-dimensionally on a printed circuit board at positions corresponding to those of holes of the punched card. The photo-conductive elements are connected in series with respective associated diodes, and the individual series circuits are connected in matrix form.

1 Claim, 9 Drawing Figures

LIGHT SENSOR MATRIX DEVICE CONSISTING OF PHOTO-CONDUCTIVE ELEMENTS

This invention relates to light sensor matrix devices consisting of groups of sandwich-type CdS photo-conductive elements for the static reading of data from punched cards and for the pattern recognition.

Heretofore proposed light sensor devices for the above purposes use silicon photo-transistors and photo-diodes. However, this type of silicon light sensors are very expensive at present, and since many elements must be arranged two-dimensionally for the above purposes they have not been put into practical use due to their high cost.

In another aspect, even with NPN photo-transistors, which are said to be the most sensitive among silicon light sensor elements, if they are to be directly coupled to a logic circuit and the like without using any amplifier it is necessary to have a light source with an illumination intensity of about 100 to 300 ft-c. Such a light source gives off considerable heat, which is a significant problem for silicon light sensors which are inferior in temperature characteristics.

CdS photo-sensitive elements, on the other hand, are more sensitive to light and are available more inexpensively, so their application to the above ends is expected. The presently used CdS photo-sensitive elements, however, are all of a planar structure with the electrode formed on the same side as the photo-sensitive layer. Usually, about one half the light-receiving area of the element is covered with an electrode metal layer. Where small photo-sensitive elements are closely arranged, the light-receiving area of one element is naturally very small and the available photocurrent is very low. Therefore, for the aforementioned purposes where the light sensitive area of the individual elements has to be extremely small, there is an inherent problem in the actual use of the CdS photo-sensitive elements in the aspect of light sensitivity.

Figure 4A:
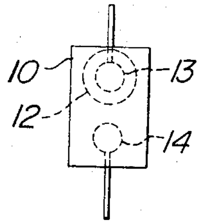
Figure 4B:
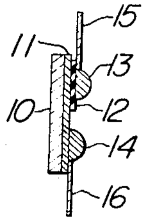
Figure 5:
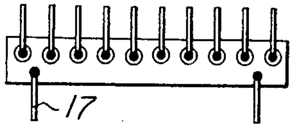
Figure 6A:
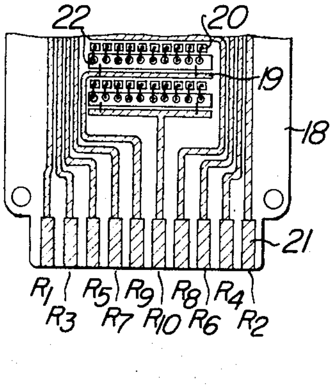
Figure 6B:
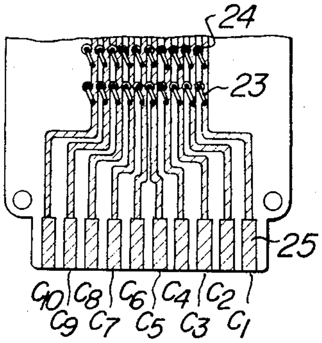
Figure 6C:
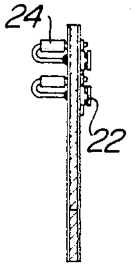

FIGS. 4*a* and 4*b* show, respectively in front and side view, an example of the photo-sensitive element used as a tip in the light sensor according to the invention;

FIG. 5 is a front view of another example of the light sensor array according to the invention; and FIGS. 6*a*, 6*b* and 6*c* are fragmentary front, back and side views of an embodiment of the light sensor device according to the invention.

Figure 1:
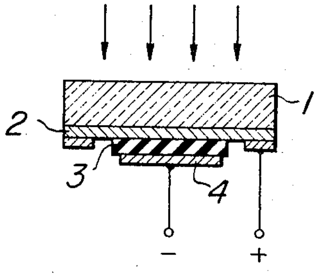
FIG. 1 is a pictorial sectional view illustrating the principles of a photo-sensitive element used in the light sensor device according to the invention.

Referring to FIG. 1, the sandwich-type CdS photo-sensitive element used in accordance with the invention has a transparent glass substrate 1 covered on one side with a transparent conducting film 2, on which is formed a sintered CdS photo-sensitive layer 3, which is in turn covered with an electrode metal layer 4. With this construction, there is no electrode present on the light receiving side. Also, the distance between adjacent electrodes when these elements are arranged may be reduced to about one-tenth compared to the case of using conventional elements. Thus, high light sensitivity may be readily ensured with a small light sensitive area. With this structure, it is possible to employ these CdS photo-sensitive elements for the afore-mentioned purposes where many such elements are arranged two-dimensionally.

In arranging photo-sensitive elements two-dimensionally, there are two methods of circuit connections to derive independent output signals from the respective elements.

Figure 2:
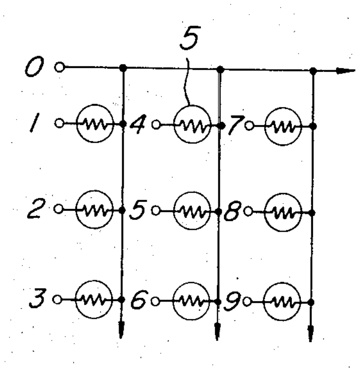
FIGS. 2 and 3 are wiring diagrams showing alternative circuit connections of the light sensor using photo-sensitive elements.

FIG. 2 shows one such method, in which individual elements 5 have one electrode commonly connected and the other independently taken out. In this arrangement the number of the output terminals is $n+1$, where n is the number of the elements.

Figure 3:
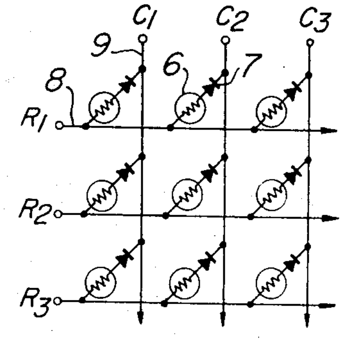

FIG. 3 shows the other method, in which individual elements 6 are in series with their associated diode 7, and the individual series circuits are connected in a matrix form between crossing X and Y common lines 8 and 9. In this arrangement, the number of the output terminals is X + Y, XY being equal to $n$. If X = Y, it is $2\sqrt{n}$.

The arrangement in the direction of X lines are usually termed "row," while the arrangement in the direction of Y lines are termed "column." Since the CdS photo-sensitive elements usually possess no polarity, they are connected in series with the respective diodes when they are arranged in the above matrix form. Otherwise, they would be by-passed and independent output signals could not be obtained. Sandwich-type photo-sensitive elements, on the other hand, are of a polar character, so if their number in the arrangement is small, independent output signals may be obtained without any series diode. However, as their rectification ratio is small compared to the usual silicon diode, series diodes are required if n is very large. Otherwise, degradation of the signal-to-noise ration results.

In accordance with the invention, a plurality of sandwich-type CdS photo-sensitive elements are used together with the associated diodes arranged into a matrix to provide a light sensor matrix device for the static reading of data from punched cards and the pattern recognition.

FIGS. 4*a* and 4*b* show an example of the CdS photo-sensitive element (hereinafter referred to as a chip) to be used in a sensor device for the reading of data from punched cards. For the reading of data from punched cards, the standard center-to-center distance between adjacent holes in adjacent columns is 0.087 inch and the standard center-to-center distance between adjacent holes in adjacent rows is 0.25 inch. The dimensions of the single chip, therefore, should be sufficiently small to be accommodated within the above distances. Also, the longer dimension of the punched card hole is 0.125 inch and the shorter dimension is 0.055 inch, so that the diameter of the effective light-receiving area of the chip should be less than 0.055 inch. Since the sandwich-type CdS photo-sensitive element is highly sensitive to light, the above dimensional requirements are sufficiently met. In the chip of FIGS. 4*a* and 4*b*, the dimensions of transparent glass substrate 10 covered with a transparent conducting film 11 are 0.079 inch × 0.118 inch, the diameter of the CdS photo-sensitive layer 2 is 0.055 inch, and the diameter of the electrode 13 is 0.032 inch. Numerals 15 and 16 designate leads from the respective electrodes 13 and 14.

FIG. 5 shows a light sensor array (hereinafter referred to as a module) having 10 sandwich-type photo-sensitive elements formed on a single elongate substrate and uniformly spaced to correspond to the distance between the adjacent columns of the punched card. These elements have one commonly connected electrode which is taken out through two leads 17.

FIGS. 6*a*, 6*b* and 6*c* show an embodiment of the light sensor matrix device according to the invention, which is designed for the static reading of data from 10-columns and 10-rows punched cards. In the Figures, only a portion including the ninth and tenth rows and terminals is shown.

FIG. 6*a* shows the front side of the device. Numeral 18 designates a printed circuit board (*pc* board) numeral 19 a common lead line for the ninth row, and numeral 20 island electrodes. Numeral 21 designates terminals of the respective rows gathered at one end of the pc board. They can be readily removed and inserted through connector means. Numeral 22 designates a sandwich-type CdS photo-sensitive element module having a light-sensitive area on the front side. It has two leads connected to the common lead line of the row and 10 leads connected to the respective island electrodes.

FIG. 6*b* shows the back side of the device. Numeral 23 designates common lead lines of the respective columns, numeral 24 diodes, and numeral 25 terminals of the respective columns arranged to overlap the terminals of the row on the front side.

FIG. 6*c* is a side view of the device. The diodes 24 are connected to the leads of the associated columns through leads extending through holes formed from the back side of the pc board to the corresponding island electrodes. They are also connected on the front side to the common lead line of the associated row. Thus, the individual series circuits of photo-sensitive element and diode are connected as a whole in a matrix form as shown in FIG. 3.

Since the sandwich-type CdS photo-sensitive element provides a polar characteristic, the series diode should be connected to provide the same polarity as that of the photo-sensitive element as shown in FIG. 3.

The above embodiment of FIGS. 6*a*, 6*b* and 6*c* uses modules. It is necessary that 10 photo-sensitive elements in one module have the same characteristics. Also, the difference in the characteristics among the individual modules gives rise to various problems depending on the way of the output signals are derived. In such cases, single-element chips having the same characteristics may be used in place of the modules.

Although the above description has been concerned with a light sensor matrix for the reading of data from punched cards, the same matrix construction may be employed for the pattern recognition. To this end, the distance between adjacent rows is made equal to the distance between adjacent columns.

The sandwich-type CdS photo-sensitive sensor matrix of the construction described above can be used for the reading-out of data from punched cards, which has been difficult with conventional CdS photo-sensitive elements. Also, it provides a light sensitivity about 100 times as high as that in case of using conventional silicon photo-transistors. Further, the sandwich-type CdS photo-sensitive elements can be readily fabricated on a mass production basis, which is advantageous from the standpoint of manufacturing costs. Furthermore, since the terminals of the respective rows and columns are gathered at one end of the *pc* board, the matrix may be readily connected to the associated circuit and its handling is very simple.

Moreover, since a light sensitivity about 100 times as high as that in case of using silicon photo-transistors is obtained, an illumination intensity of only about 10 ft-c is sufficient, which is low compared to the 100 to 300 ft-c required as a light source in case of using the conventional silicon photo-transistors. Thus, the power consumption of the light source can be extremely reduced. Also, the peripheral temperature rise is reduced, thus eliminating undesired effects on the electric circuit.

Still further, unlike the case of using low-sensitivity silicon photo-transistors the sensor matrix according to the invention can be directly connected to the logic circuit (DTL or TTL) without using any amplifier. Thus, the sensor matrix according to the invention is suited for use in various input terminal of computers and automatic dial telephones.

What is claimed is:

1. A light sensor device comprising a printed circuit board, a matrix of a sandwich-type CdS photo-sensitive elements arranged on the front side of said printed circuit in a plurality of rows and columns, groups of island electrodes arranged on the front side of said printed circuit board, each island electrode group associating with a corresponding row of photo-sensitive elements in the form of individual chips or grouped in a module, said printed circuit board being provided with common lead lines for the respective rows of photo-sensitive elements on the front side and with common lead lines for the respective columns of photo-sensitive elements on the back side, and diodes connected in series with respective photo-sensitive elements, said diodes being connected to the corresponding island electrodes through leads extending through respective holes formed from the back side of said printed circuit board to said respective diodes and being connected to form a matrix, and said common lead lines for said respective rows and columns being connected to respective terminals gathered at one end of said print circuit board.

* * * * *